US008035655B2

(12) United States Patent
Kim et al.

(10) Patent No.: US 8,035,655 B2
(45) Date of Patent: Oct. 11, 2011

(54) SYSTEM AND METHOD FOR CONVERTING RGB TO RGBW COLOR USING WHITE VALUE EXTRACTION

(75) Inventors: Yun-Tae Kim, Suwon-si (KR); Du-Sik Park, Suwon-si (KR); Ju Yong Park, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 861 days.

(21) Appl. No.: 12/045,799

(22) Filed: Mar. 11, 2008

(65) Prior Publication Data

US 2009/0085926 A1 Apr. 2, 2009

(30) Foreign Application Priority Data

Oct. 1, 2007 (KR) ........................ 10-2007-0098956

(51) Int. Cl.

| | |
|---|---|
| ***G09G 5/02*** | (2006.01) |
| ***G09G 5/00*** | (2006.01) |
| ***H04N 1/60*** | (2006.01) |
| ***H04N 1/46*** | (2006.01) |
| ***G03F 3/08*** | (2006.01) |
| ***G06K 9/00*** | (2006.01) |
| ***G06K 9/32*** | (2006.01) |
| *G06K 9/36* | (2006.01) |
| *G06K 9/40* | (2006.01) |
| *H04N 4/225* | (2006.01) |

(52) U.S. Cl. ........ 345/604; 345/581; 345/590; 345/600; 345/606; 348/254; 348/441; 348/557; 358/518; 358/519; 358/523; 358/525; 382/167; 382/300; 382/254; 382/274

(58) Field of Classification Search .................. 345/581, 345/589, 590–591, 586, 606, 600–604, 618, 345/643; 348/254, 256, 441, 444, 557, 567, 348/663, 671; 358/1.9, 3.23, 518, 519, 523, 358/525; 382/162–167, 254, 274, 276, 300
See application file for complete search history.

(56) References Cited

U.S. PATENT DOCUMENTS

| | | | | |
|---|---|---|---|---|
| 7,619,637 | B2 * | 11/2009 | Higgins et al. | 345/604 |
| 2005/0083341 | A1 * | 4/2005 | Higgins et al. | 345/590 |
| 2007/0081177 | A1 * | 4/2007 | Um et al. | 358/1.9 |
| 2007/0201063 | A1 * | 8/2007 | Bang et al. | 358/1.9 |
| 2008/0062443 | A1 * | 3/2008 | Olson | 358/1.9 |
| 2008/0170083 | A1 * | 7/2008 | Han et al. | 345/589 |
| 2008/0186325 | A1 * | 8/2008 | Higgins et al. | 345/592 |
| 2009/0278867 | A1 * | 11/2009 | Brown et al. | 345/690 |

FOREIGN PATENT DOCUMENTS

| | | |
|---|---|---|
| JP | 2000-330523 | 11/2000 |
| JP | 2006-197584 | 7/2006 |
| KR | 2006-113681 | 11/2006 |
| KR | 2006-122882 | 11/2006 |
| WO | WO 2005/043502 | 5/2005 |
| WO | WO 2005/048232 | 5/2005 |

* cited by examiner

*Primary Examiner* — Wesner Sajous
(74) *Attorney, Agent, or Firm* — Staas & Halsey LLP

(57) ABSTRACT

A system and method of converting a red-green-blue (RGB) pixel to a red-green-blue-white (RGBW) pixel by using a W value extraction, the RGB-to-RGBW converting system including: a lookup table generator to generate an RGBW lookup table using one or more RGB lattice points; and an RGBW value computation unit to compute an RGBW value of an input pixel with respect to an RGB value of the input pixel based on the generated RGBW lookup table.

25 Claims, 9 Drawing Sheets

SYSTEM AND METHOD FOR CONVERTING RGB TO RGBW COLOR USING WHITE VALUE EXTRACTION

CROSS-REFERENCE TO RELATED APPLICATION

This application claims the benefit of Korean Application No. 2007-98956, filed Oct. 1, 2007 in the Korean Intellectual Property Office, the disclosure of which is incorporated herein by reference.

BACKGROUND OF THE INVENTION

1. Field of the Invention

Aspects of the present invention relate to a system and method of converting a red-green-blue (RGB) value to a red-green-blue-white (RGBW) value by using a white (W) value extraction, which is applicable to all display devices that can be expressed using sub-pixels (for example, a transmission display device such as a liquid crystal display (LCD) device and a plasma display panel (PDP) device, a transreflective-type display device such as an electronic paper, a self-light emitting system such as an organic light emitting diode (OLED), etc.).

2. Description of the Related Art

Conventionally, various types of schemes exist to extract a red-green-blue-white (RGBW) value from a red-green-blue (RGB) value. Generally, such conventional schemes to extract an RGBW value use a simple algorithm. For example, a W value may be conventionally computed by applying a Min( ) function to an RGB value. Similarly, an RGB value may be converted into a YUV value, and then again converting the YUV value into an RGBW value.

However, according to the conventional art, when using the Min( ) function, a minimum value of the RGB value is used. Therefore, the entire gamut boundary of a system may not be sufficiently used. Also, when performing a color space conversion using the YUV value, a relatively greater weight may be assigned to a Y signal. Therefore, the entire saturation may be deteriorated.

Accordingly, there is a need for a method of extracting a W value that can maximally use the gamut boundary of a color space, while appropriately reflecting a luminance value and a saturation value of the color space.

SUMMARY OF THE INVENTION

Aspects of the present invention provide a system and method of converting a red-green-blue (RGB) pixel to a red-green-blue-white (RGBW) pixel by extracting a W value using a maximum saturation value that is located in a gamut boundary of a color space in which a luminance and a saturation are independent. Aspects of the present invention further provide a extraction of a W value in which the W value is proportional to a luminance value of an input pixel and is inversely proportional to a saturation ratio. Therefore, it is possible to extract a W value that can appropriately reflect the luminance value and the saturation value of the input pixel.

Aspects of the present invention also provide a system and method of converting an RGB pixel to an RGBW pixel by converting an RGB value of an input pixel, excluded from an RGBW lookup table, into an RGBW value using the RGBW lookup table. Accordingly, it is possible to convert the RGB value of the input pixel into the RGBW value with relatively fewer computations by using a tetrahedral interpolation based on the RGBW lookup table.

According to an aspect of the present invention, there is provided a system to compute a white (W) value of an input pixel, the system including: a color space converter to convert a red-green-blue (RGB) value of the input pixel into a color space in which a luminance and a saturation are independent; a maximum saturation value determination unit to determine a maximum saturation value using a luminance value and a saturation value of the input pixel, wherein the maximum saturation value is located in a gamut boundary of the color space; and a W value computation unit to compute the W value of the input pixel using a saturation ratio and the luminance value, wherein the saturation ratio is determined based on the saturation value of the input pixel and the maximum saturation value.

The W value computation unit may compute the W value to be a value that is proportional to the luminance value of the input pixel and is inversely proportional to the saturation value of the input image.

According to another aspect of the present invention, there is provided a system to convert an RGB value to an RGBW value, the system including: a lookup table generator to generate an RGBW lookup table using one or more RGB lattice points; and an RGBW value computation unit to compute an RGBW value of an input pixel with respect to an RGB value of the input pixel based on the generated RGBW lookup table.

The lookup table generator may include: a lattice point setting unit to separate each of R, G and B channels by a predetermined interval and to set a plurality of RGB lattice points according to the separated R, G, and B channels; a W value extractor to compute a W value for each of the RGB lattice points; and a lookup table determination unit to generate the RGBW lookup table with respect to each of the RGB lattice points using the corresponding computed W values.

The RGBW value computation unit may include: a hexahedron selector to set a plurality of hexahedra according to the RGBW lookup table and to select a hexahedron that includes the RGB value of the input pixel from the plurality of hexahedra; a tetrahedron selector to separate the selected hexahedron into a plurality of tetrahedra and to select a tetrahedron that includes the RGB value of the input pixel from the plurality of tetrahedra; and an RGBW value interpolation unit to interpolate the RGBW value using points of the selected tetrahedron and the RGB value of the input pixel.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
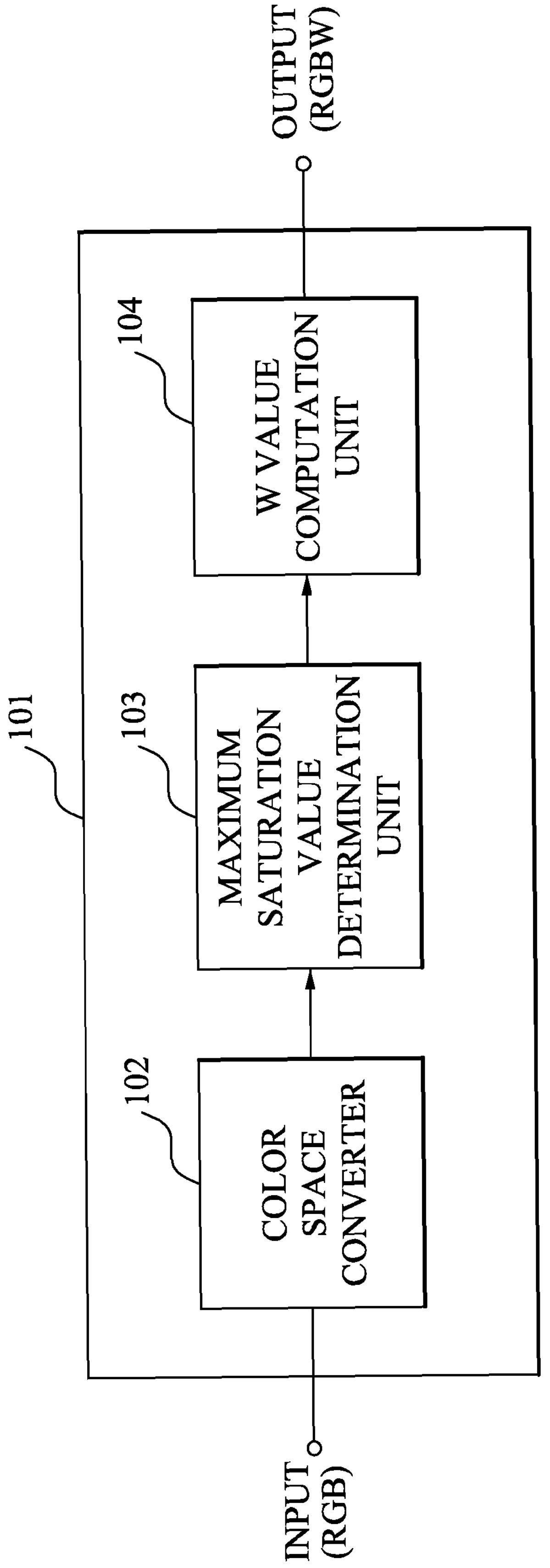
FIG. 1 is a block diagram illustrating an internal configuration of a system to compute a W value according to an embodiment of the present invention.

Reference will now be made in detail to present embodiments of the present invention, examples of which are illustrated in the accompanying drawings, wherein like reference numerals refer to the like elements throughout. The embodiments are described below in order to explain the present invention by referring to the figures.

FIG. 1 is a block diagram illustrating an internal configuration of a system 101 to compute a W value according to an embodiment of the present invention. Referring to FIG. 1, the system 101 includes a color space converter 102, a maximum saturation value determination unit 103, and a W value computation unit 104.

The color space converter 102 converts a red-green-blue (RGB) value of an input pixel into a color space where a luminance and a saturation are independent. The color space where the luminance and the saturation are independent may, for example, be CIEL*a*b, CIEXYZ, YCbCr, YUV, Hue Saturation Value (HSV) color spaces, etc. As an example, the present embodiment will be described with the color space converter 102 converting the RGB value of the input pixel into the CIEL*a*b color space. However, it is understood that aspects of the present invention are not limited thereto, and other color spaces where the luminance and saturation are independent may be used.

The CIEL*a*b color space effectively reflects the visual sense of a human being. Therefore, when the W value is expressed on a display by extracting the white (W) value, a more luminous effect may be obtained. However, when computing the W value in the CIEL*a*b color space, it is possible to readily adjust parameters of a function and thereby extract the W value that is appropriate for a red-green-blue-white (RGBW) output display device.

The maximum saturation value determination unit 103 determines a maximum saturation value using a luminance value and a saturation value of the input pixel. The maximum saturation value is located in a gamut boundary of the color space. That is, the maximum saturation value determination unit 103 determines, as the maximum saturation value, a point that is located in the gamut boundary using the saturation value and the luminance value of the input pixel. According to an aspect of the present invention, the gamut boundary of a device may be sufficiently used by extracting a W value that is located in the gamut boundary of the color space (the CIEL*a*b color space in the present description). A method of determining the maximum saturation value will be described in detail with reference to FIG. 2.

The W value computation unit 104 computes a W value of the input pixel using a saturation ratio and the luminance value. The saturation ratio is determined according to the saturation value and the maximum saturation value. In an aspect of the present invention, the W value computation unit 104 computes the W value to be a value that is proportional to the luminance value of the input pixel and is inversely proportional to the saturation value of the input image.

Generally, as the input pixel is closer to a pure color, a relatively higher saturation value is output. Conversely, as the input pixel is closer to an achromatic color, a relatively lower saturation value is obtained. Therefore, when the input pixel is closer to the pure color with the relatively higher saturation, the W value computed by the W value computation unit 104 may be relatively low. Similarly, when the input pixel is closer to the achromatic color with the relatively lower saturation, the W value computed by the W value computation unit 104 may be relatively high.

If the input pixel represents a saturation that is close to the saturation of the pure color and the W value of the input pixel is relatively high, the saturation of the pure color may appear relatively low. Specifically, when the W value is extracted, the saturation of the pure color appears relatively less luminous than before the W value is extracted. Therefore, the higher the saturation of the input pixel (i.e., as the saturation of the input pixel is closer to the pure color), the smaller the W value computed by the W value computation unit 104.

According to an aspect of the present invention, the greater the luminance value of the input pixel, the higher the W value computed by the W value computation unit 104. Conversely, the smaller the luminance value of the input pixel, the lower the W value computed by the W value computation unit 104. A method of computing the W value will be described in detail with reference to FIG. 3.

Figure 2:
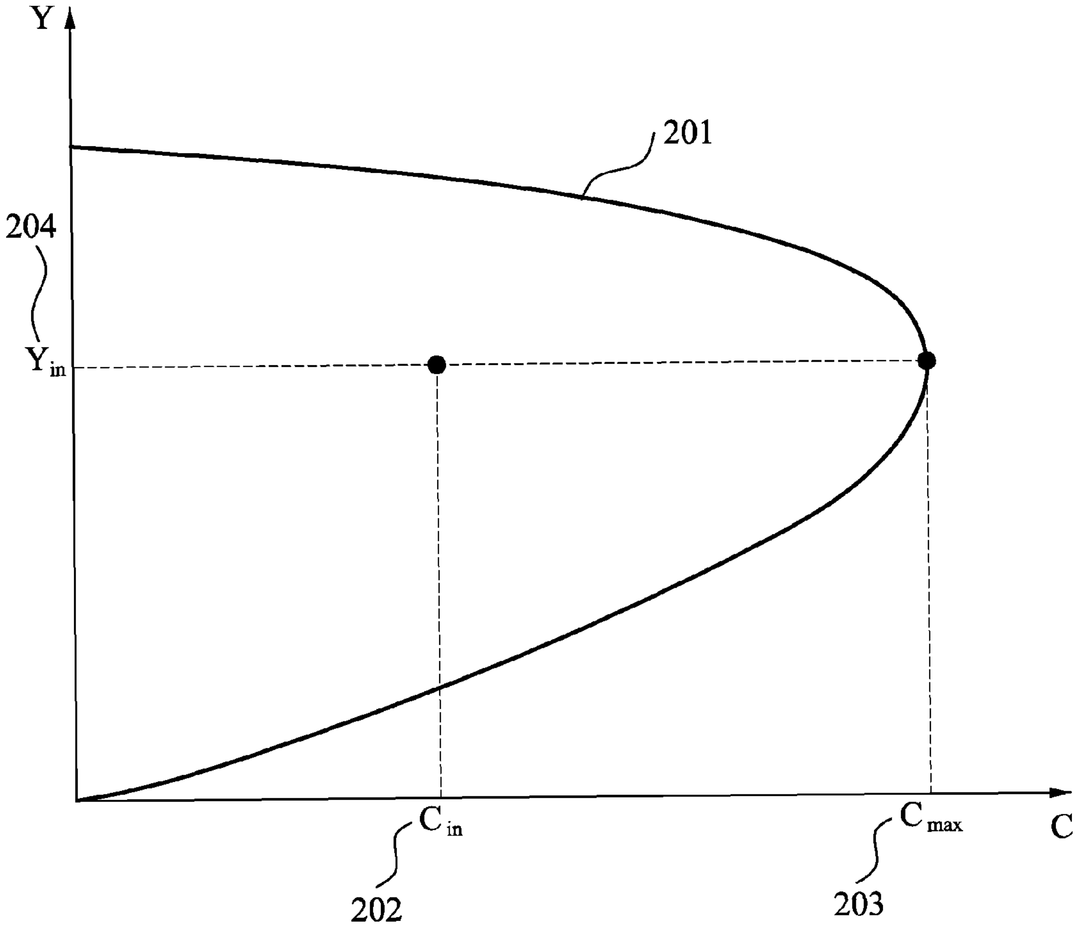
FIG. 2 is a graph illustrating a process of determining a maximum saturation value using a gamut boundary according to an embodiment of the present invention.

FIG. 2 is a graph illustrating a method of determining a maximum saturation value using a gamut boundary according to an aspect of the present invention. Referring to FIG. 2, the horizontal axis of the graph denotes a saturation value C and the vertical axis denotes a luminance value Y. Specifically, the graph represents a color space where the saturation value and the luminance value are independent. A curve 201 is a gamut boundary in the color space. For example, the curve 201 may represent the gamut boundary 201 in the CIEL*a*b color space. It is understood that the gamut boundary 201 may differ depending on a display device and a color space.

According to an aspect of the present invention, the maximum saturation value determination unit 103 determines a maximum saturation value $C_{max}$ 203 using a saturation value $C_{in}$ 202 and a luminance value $Y_{in}$ 204 of an input pixel. The maximum saturation value $C_{max}$ 203 is located in the gamut boundary 201 of the color space. Referring to FIG. 2, the maximum saturation value determination unit 103 determines a point that is located in the gamut boundary 201 as the maximum saturation value $C_{max}$ 203 using the saturation value $C_{in}$ 202 and the luminance value $Y_{in}$ 204. According to an aspect of the present invention, the maximum saturation value $C_{max}$ 203 that is located in the gamut boundary 201 of the color space may differ according to the saturation value $C_{in}$ 202 and the luminance value $Y_{in}$ 204. The graph of FIG. 2 represents a color space in which the luminance and the saturation are independent. As described above, the CIEL*a*b color space is used as a non-limiting example for purposes of the present description.

According to an aspect of the present invention, when computing a W value using a luminance value and a saturation value, a maximum saturation value located in a gamut boundary is used. Thus, it is possible to maximally use the gamut boundary of a display device.

Figure 3:
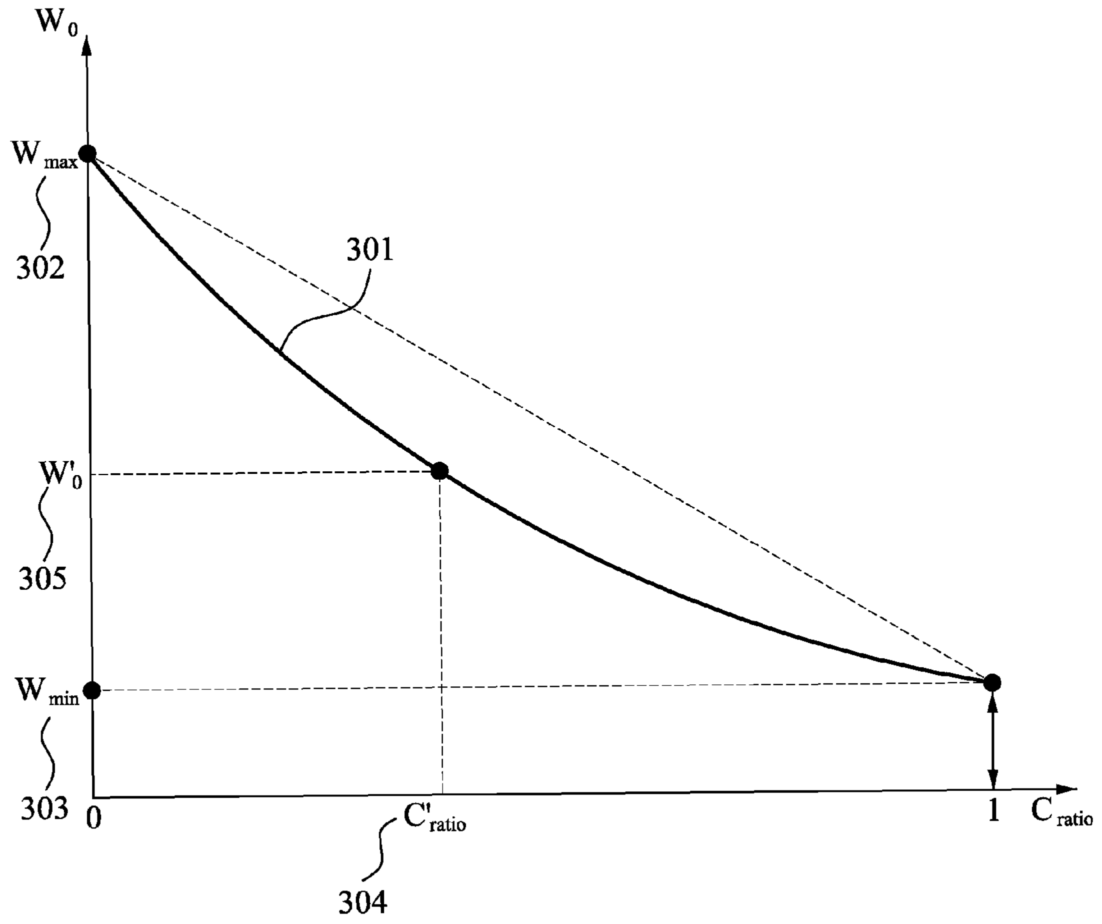
FIG. 3 is a graph illustrating a change in a W value that is computed based on a saturation ratio and a luminance value according to an embodiment of the present invention.

FIG. 3 is a graph illustrating a change in a W value that is computed based on a saturation ratio and a luminance value according to an embodiment of the present invention. Referring to FIG. 3, the horizontal axis denotes a saturation ratio $C_{ratio}$, and the vertical axis denotes the W value ($W_o$). A curve 301 denotes the change in the W value, and is inversely proportional to the saturation ratio $C_{ratio}$. The curve 301 may be determined by Equation 1:

$$W_o = W_{max} \times \left[ \frac{W_{max} + (W_{min} - W_{max}) \times C_{ratio}}{W_{max}} \right]^{\alpha} \quad \text{[Equation 1]}$$

$$W_{max} = k \cdot Y_{in},$$

where the saturation ratio $C_{ratio}$ is the ratio between the maximum saturation value and the saturation value of the input pixel, and may be represented as $$C_{ratio} = \frac{C_{in}}{C_{max}}.$$

Furthermore, $C_n$ denotes the saturation value of the input pixel, and $C_{max}$ denotes the maximum saturation value. When the saturation value of the input pixel is 0, the saturation ratio is 0 (i.e., a minimum value). Specifically, when the saturation value of the input pixel is 0, the input pixel is an achromatic color. Similarly, when the saturation value of the input pixel is equal to the maximum saturation value, the saturation ratio is 1 (i.e., a maximum value), and the input pixel is a pure color.

$W_{max}$ 302 denotes a W value when the saturation ratio is the minimum value (i.e., when the saturation ratio is 0 in the graph). $W_{min}$ 303 denotes a W value when the saturation ratio is the maximum value (i.e., when the saturation ratio is 1 in the graph). Specifically, $W_{max}$ 302 corresponds to the W value to be used for the achromatic color and $W_{min}$ 303 corresponds to the W value to be used for the pure color.

Referring to Equation 1, $W_{max}$ 302 is determined by $Y_{in}$, which is the luminance value of the input pixel. K is a constant to adjust $W_{max}$ 302 and may adjust the W value in the achromatic color. Consequently, the curve 301 may be used to extract the W value of the input pixel that has a saturation between the pure color and the achromatic color.

a denotes a constant greater than 1. As a increases, the curve 301 is formed so that the W value radically decreases as the saturation ratio increases. Specifically, in the case of the input pixel having a saturation between the pure color and the achromatic color, the W value of the input pixel increases as a approaches 1. Consequently, when a is reduced to approach 1, the W value increases and the luminance of the input pixel is relatively higher while the saturation of the input pixel may be relatively lower. Therefore, it is possible to increase the luminance of the input pixel without significantly deteriorating the saturation of the input pixel by appropriately adjusting a.

Figure 4:
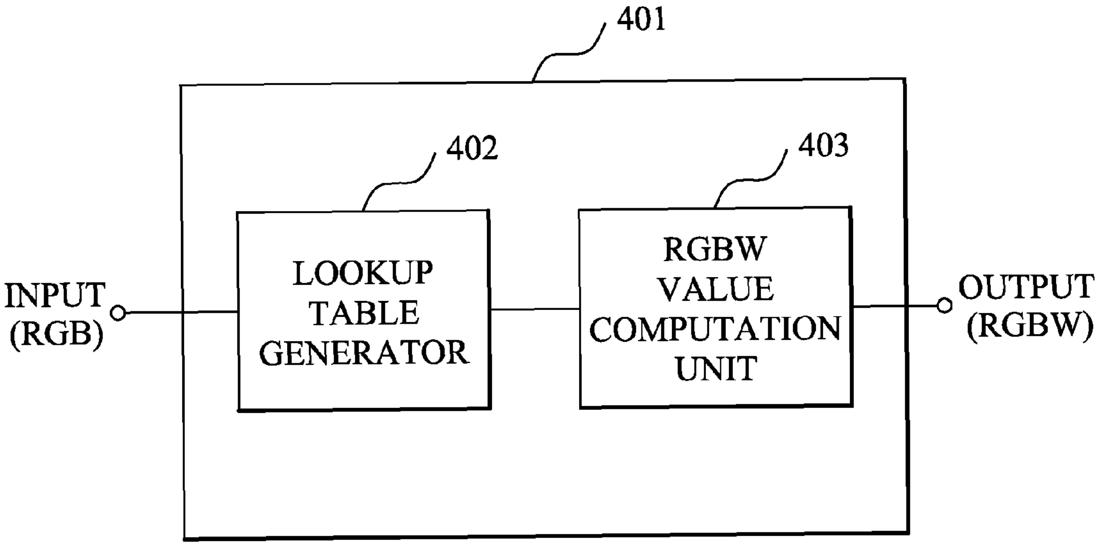
FIG. 4 is a block diagram illustrating an internal configuration of an RGB-to-RGBW converting system according to an embodiment of the present invention.

FIG. 4 is a block diagram illustrating an internal configuration of an RGB-to-RGBW converting system 401 according to an embodiment of the present invention. Referring to FIG. 4, the RGB-to-RGBW converting system 401 includes a lookup table generator 402 and an RGBW value computation unit 403.

According to an aspect of the present invention, the RGB-to-RGBW converting system 401 generates an RGBW lookup table for RGB values in advance using the system to compute the W value (illustrated in FIG. 1). Accordingly, the RGB-to-RGBW converting system 401 may more quickly convert the RGB value of the input pixel into an RGBW value by using the generated RGBW lookup table.

The lookup table generator 402 generates the RGBW lookup table using an RGB lattice point. Furthermore, the lookup table generator 402 separates each of R, G and B channels by a predetermined interval, sets a plurality of RGB lattice points, and calculates a W value of each of the RGB lattice points. The lookup table generator 402 determines an RGBW lookup table with respect to the RGB lattice point using the computed W value. The lookup table generator 402 will be described later in detail with reference to FIG. 5.

The RGBW value computation unit 403 computes an RGBW value with respect to an RGB value of an input pixel based on the generated RGBW lookup table. As an example, the RGBW value computation unit 403 may compute an RGBW value with respect to an RGB value of the input pixel that does not exist in the RGBW lookup table. In contrast, an RGB value of an input pixel that does exist in the RGBW lookup table may be converted into an RGBW value based on the RGBW lookup table, without the need of a separate computation process.

For example, the RGBW value computation unit 403 may convert the RGB value of the input pixel into the RGBW value using an interpolation, based on the RGBW lookup table. The interpolation may be widely used to convert a color space or to correct color. Specifically, the interpolation makes it possible to convert the color space using a relatively small number of measurement values, and relatively greater accuracy can therefore be achieved.

According to an aspect of the present invention, the RGBW value computation unit 403 may compute the RGBW value from the RGB value of the input pixel through a tetrahedral interpolation. The tetrahedral interpolation may be more simply performed in comparison to other interpolations. Also, the tetrahedral interpolation is performed using four points of the tetrahedron, and thus it is possible to maintain the accuracy of the interpolation while reducing an amount of computation. The tetrahedral interpolation will be described in detail with reference to FIGS. 6 and 7.

Figure 5:
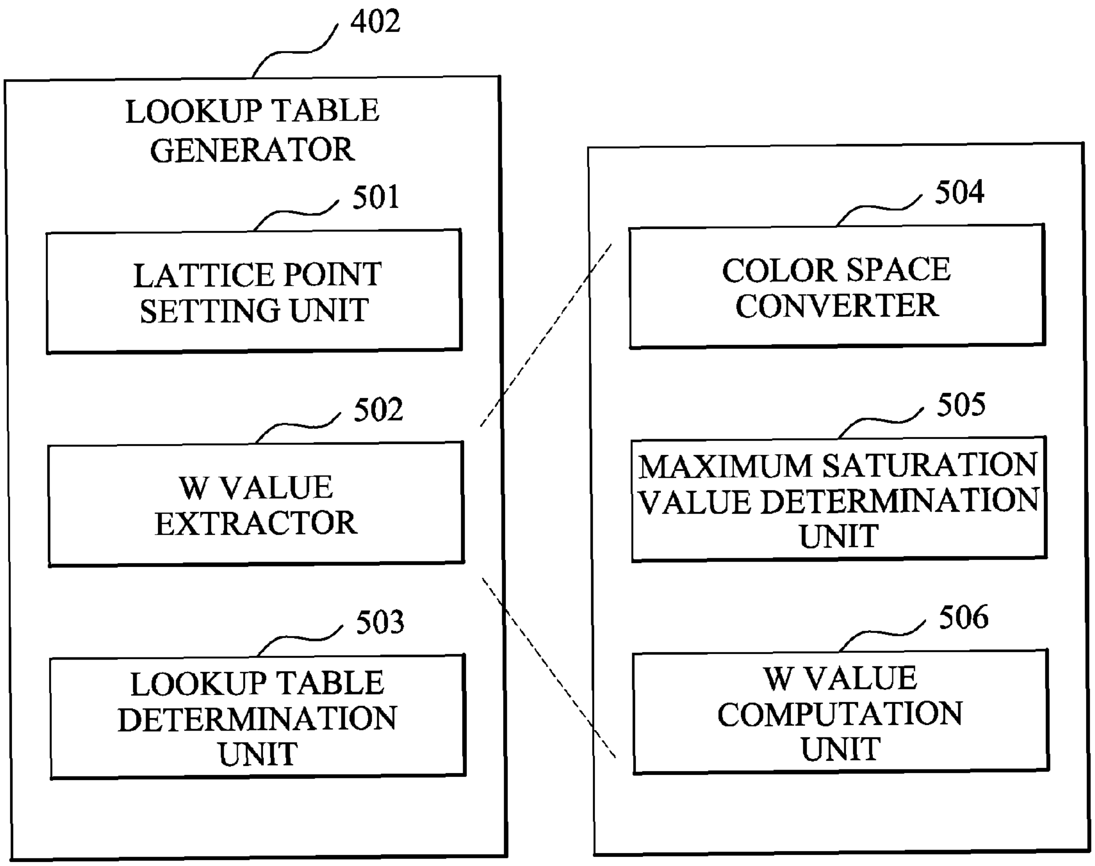
FIG. 5 is a block diagram illustrating an internal configuration of a lookup table generator of an RGB-to-RGBW converting system according to an embodiment of the present invention.

FIG. 5 is a block diagram illustrating an internal configuration of the lookup table generator 402 of the RGB-to-RGBW converting system 401 according to an embodiment of the present invention. Referring to FIG. 5, the lookup table generator 402 includes a lattice point setting unit 501, a W value extractor 502, and a lookup table determination unit 503.

The lattice point setting unit 501 separates each of R, G and B channels by a predetermined interval and sets a plurality of RGB lattice points. For example, in the case of an 8-bit image, each of the R, G, and B channels of the input pixel may have any value of 0 through 255. The RGBW lookup table is generated by sampling only a portion of lattice points $255^3$ that can be combined as values of each of the R, G, and B channels. When values of the R channel are separated into six intervals, the lattice points may be set as (0,0,0), (51,0,0), (102,0,0), (153,0,0), (204,0,0), and (255,0,0). Similarly, when values of the G channel are separated into six intervals in the same manner as above, the lattice points may be set as (0,0,0), (0,51,0), (0,102,0), (0,153,0), (0,204,0), and (0,255, 0). The same method of setting lattice points may also be applied to the B channel.

Therefore, when each of the R, B, and B channels is separated into six intervals, 216 (6*6*6) three dimensional (3D) lattice points may be set. For example, an RGB lattice point may be (102, 153, 51) at a location where R is (102, 0, 0), G is (0,153,0), and B is (0,0,51).

It is understood that aspects of the present invention are not limited to six intervals and 216 lattice points. For example, the number of RGB lattice points to be set may differ depending on the number of intervals. That is, as the number of intervals increases, the number of RGB lattice points increases and the size of the RGBW lookup table increases. When the size of the RGBW lookup table increases, an amount of computation may become complex and a computation speed may decrease when converting the RGB value of the input pixel into the RGBW value. Accordingly, the lattice point setting unit 501 separates each of the R, G and B channels by an appropriate interval. In the above example, the RGB lattice point setting unit 501 set the interval size to 51 so that each of the R, G, and B channels has six intervals. However, as stated above, it is understood that aspects of the present invention are not limited thereto.

The W value extractor 502 extracts (or computes) a W value of each of the RGB lattice points. For example, the W value extractor 502 may apply a W value extraction process as shown in FIG. 1. In this case, the W value extractor 502 includes a color space converter 504, a maximum saturation value determination unit 505, and a W value computation unit 506. These components are similar to those described with reference to FIGS. 1 through 3, and therefore detailed descriptions thereof will be omitted here with reference to FIG. 5.

The color space converter 504 converts each of the RGB lattice points into a color space where a luminance and a saturation are independent. The RGB lattice point be an RGB value that is sampled based on the separated interval by the lattice point setting unit 501. As described with reference to FIG. 1, various types of color spaces where the luminance and the saturation are independent may exist. As a non-limiting example for the present description, the color space converter 504 converts each of the RGB lattice points into the CIEL*a*b color space.

The maximum saturation value determination unit 505 determines a maximum saturation value using a luminance value and a saturation value of each of the RGB lattice points. The maximum saturation value is located in a gamut boundary of the color space.

The W value computation unit 506 computes a W value of each of the RGB lattice points using a saturation ratio and the luminance value. The saturation ratio is determined based on the saturation value and the maximum saturation value. For example, the W value computation unit 506 may compute the W value according to Equation 2:

$$W_o = W_{max} \times \left[ \frac{W_{max} + (W_{min} - W_{max}) \times C_{ratio}}{W_{max}} \right]^{\alpha} \qquad \text{[Equation 2]}$$

$$W_{max} = k \cdot Y_{in},$$

where $W_o$ denotes the W value, $C_{ratio}$ denotes the saturation ratio, $W_{max}$ denotes the W value when the saturation ratio is minimum, $W_{min}$ denotes the W value when the saturation ratio is maximum, $Y_{in}$ denotes the luminance value of each of the RGB lattice points, and k and a denote constants. For example, when each of the R, G, and B channels is separated into six intervals, a total 216 RGB grating points are generated and 216 W values are computed.

The lookup table determination unit 503 determines (or generates) an RGBW lookup table with respect to the RGB lattice points using the extracted W value. The RGBW lookup table may include RGBW values that are set to the sampled RGB lattice points, respectively. According to an aspect of the present invention, the RGBW lookup table may be pre-generated before computing the RGBW value.

Figure 6:
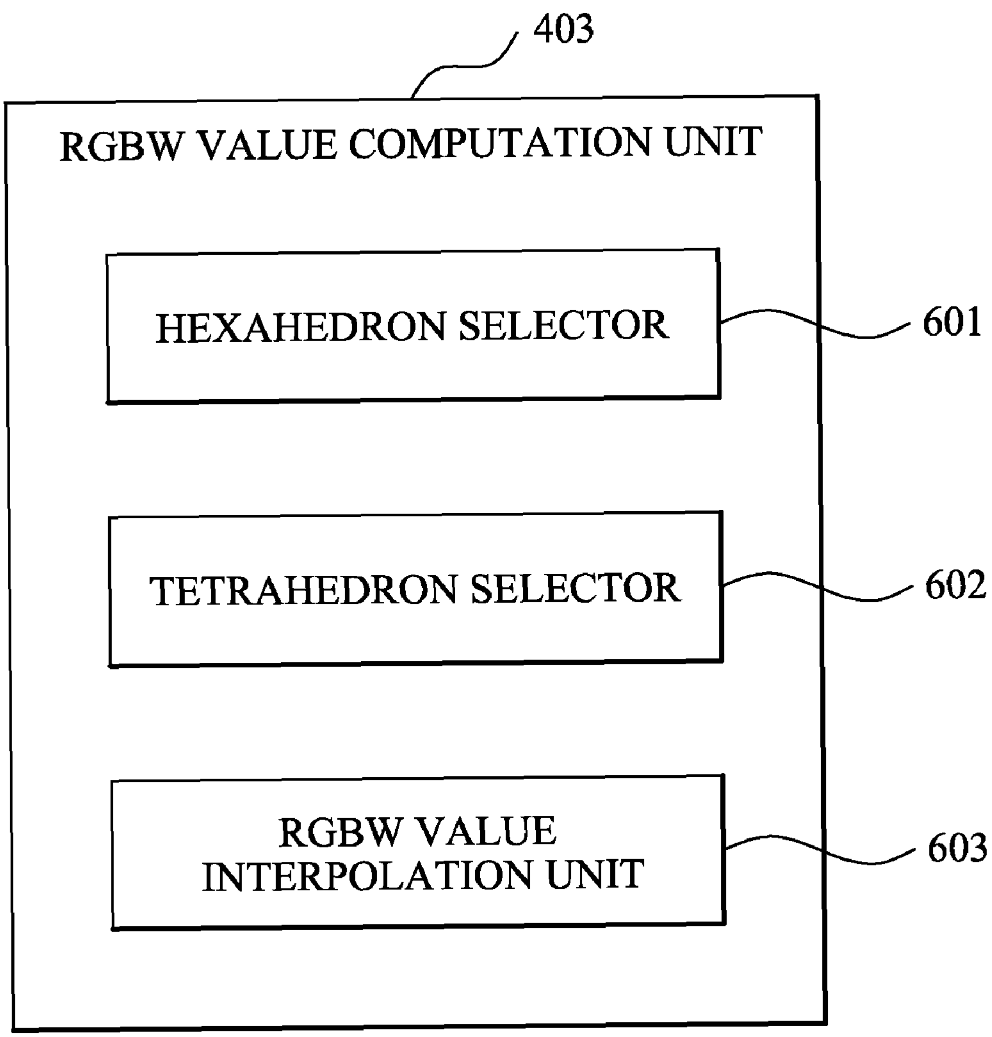
FIG. 6 is a block diagram illustrating an internal configuration of an RGBW value computation unit of an RGB-to-RGBW converting system according to an embodiment of the present invention.

FIG. 6 is a block diagram illustrating an internal configuration of the RGBW value computation unit 403 of the RGB-to-RGBW converting system 401 according to an embodiment of the present invention. Referring to FIG. 6, the RGBW value computation unit 403 includes a hexahedron selector 601, a tetrahedron selector 602, and an RGBW value interpolation unit 603. As an example, when an RGB value of an input pixel does not exist in the RGBW lookup table, the RGBW value computation unit 403 may compute an RGBW value with respect to the RGB value of the input pixel based on the generated RGBW lookup table.

The hexahedron selector 601 sets a plurality of hexahedra according to the RGBW lookup table, and selects a hexahedron that includes the RGB value of the input pixel from the plurality of hexahedra.

The tetrahedron selector 602 separates the selected hexahedron into a plurality of tetrahedra, and selects a tetrahedron that includes the RGB value of the input pixel from the plurality of tetrahedra. For example, the tetrahedron selector 602 may separate the hexahedron into six tetrahedra. A process in which the tetrahedron selector 602 selects the tetrahedron including the RGB value of the input pixel will be described in detail with reference to FIG. 7.

The RGBW value interpolation unit 603 interpolates the RGBW value using points of the selected tetrahedron and the RGB value of the input pixel. The RGBW value interpolation unit may interpolate the RGBW value using a ratio of the distance between each point of the tetrahedron and the input pixel. The point of the tetrahedron corresponds to a point that constitutes the hexahedron.

Specifically, points of the tetrahedron may be converted into the RGBW value based on the generated RGBW lookup table. As stated above, the RGB value of the input pixel does not exist in the RGBW lookup table. Therefore, the RGB value of the input pixel may be computed using a point of the tetrahedron that can be readily converted into the RGBW value based on the RGBW lookup table.

Figure 7:
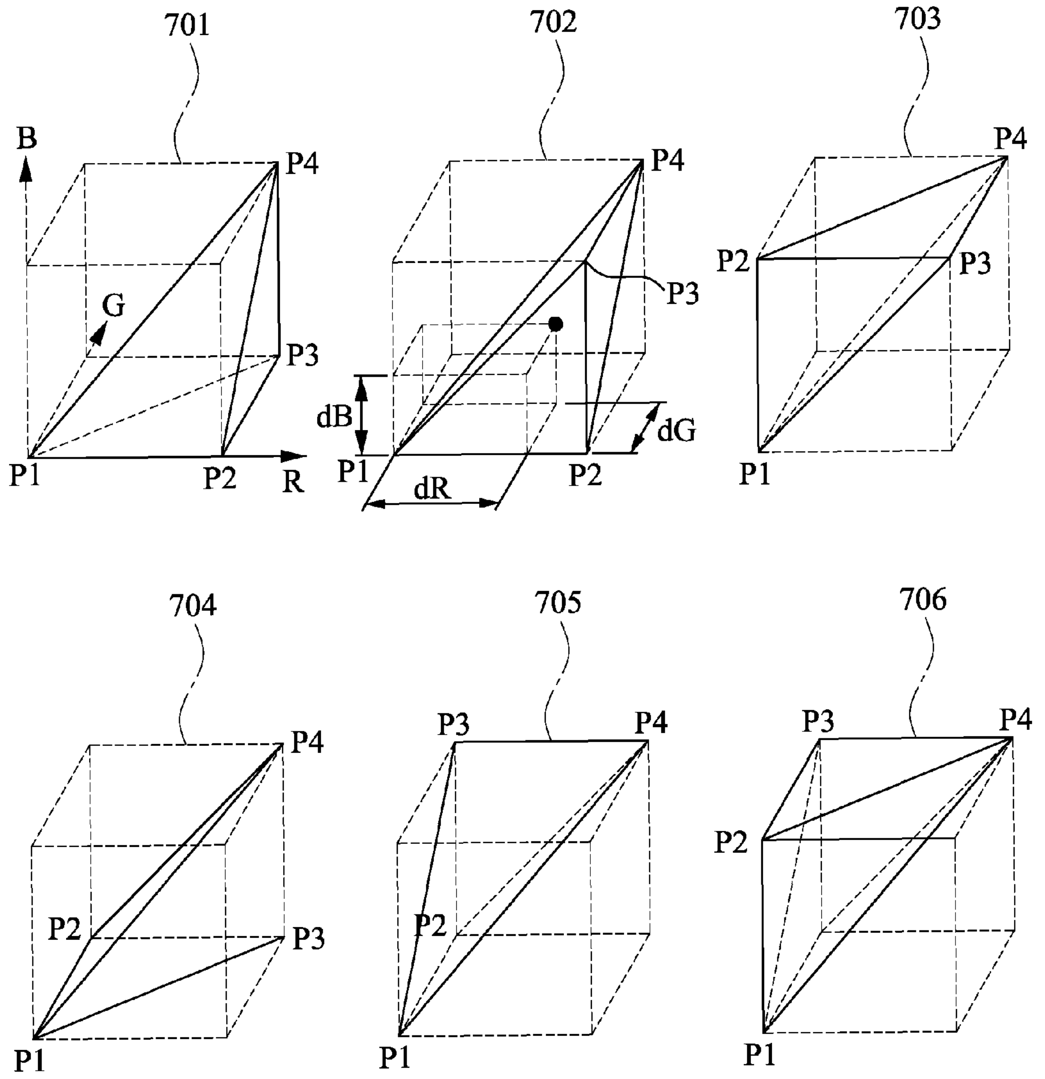
FIG. 7 illustrates examples of tetrahedra that are set based on an RGBW lookup table according to an embodiment of the present invention.

FIG. 7 illustrates examples of tetrahedra that are set based on an RGBW lookup table according to an embodiment of the present invention. Referring to FIG. 7, six tetrahedra 701, 702, 703, 704, 705, and 706 are shown in a hexahedron selected based on the RGBW lookup table. According to an aspect of the present invention, a plurality of hexahedra may be set based on the RGBW lookup table that is generated by the lookup table generator 401. A hexahedron that includes an RGB value of an input pixel is then selected from the plurality of hexahedra. FIG. 7 illustrates the hexahedron that includes the RGB value of the input pixel.

Furthermore, as illustrated in FIG. 7, the tetrahedron selector 602 separates the hexahedron into six tetrahedra 701, 702, 703, 704, 705, and 706. However, it is understood that aspects of the present invention are not limited thereto, and the hexahedron may be separated into more or less tetrahedra. The tetrahedron selector 602 selects the tetrahedron that includes the RGB value of the input pixel from the six tetrahedra 701, 702, 703, 704, 705, and 706.

The RGB value of the input pixel may be divided into an integer portion and a decimal portion. The integer portion is the point of the hexahedron shown in FIG. 7 and exists in the RGBW lookup table. For example, when the lookup table generator 401 separates each of R, G, and B channels of an eight-bit image into six intervals to generate the RGBW lookup table, the integer portion may have any one integer from among 0, 51, 102, 153, 204, and 255. The decimal portion may be represented as dR, dG, and dB (as shown in the tetrahedron 702) and has a decimal value between 0 and 1.

According to an aspect of the present invention, the tetrahedron selector 602 selects the tetrahedron including the RGB value of the input pixel using the decimal portion. Specifically, the point that exists in the tetrahedron 702 denotes the RGB value of the input pixel. As stated above, the tetrahedron selector 602 selects the tetrahedron that includes the RGB value of the input pixel from the six tetrahedra 701, 702, 703, 704, 705, and 706.

For example, the tetrahedron selector 602 may select the tetrahedron that includes the RGB value of the input pixel, using a condition table as follows:

| Tetrahedron | condition | C0 | C1 | C2 | C3 |
|---|---|---|---|---|---|
| Tetrahedron 701 | dR ≧ dG ≧ dB | P1 | P2-P1 | P3-P2 | P4-P3 |
| Tetrahedron 702 | dR ≧ dB ≧ dG | P1 | P2-P1 | P4-P3 | P3-P2 |
| Tetrahedron 703 | dB ≧ dR ≧ dG | P1 | P3-P2 | P4-P3 | P2-P1 |
| Tetrahedron 704 | dG ≧ dR ≧ dB | P1 | P3-P2 | P2-P1 | P4-P3 |
| Tetrahedron 705 | dG ≧ dB ≧ dR | P1 | P4-P3 | P2-P1 | P3-P2 |
| Tetrahedron 706 | dB ≧ dG ≧ dR | P1 | P4-P3 | P3-P2 | P2-P1 |

Four points P1, P2, P3, and P4 may be extracted from the selected tetrahedron. The RGBW value interpolation unit 603 interpolates the RGBW value using the extracted tetrahedral points P1, P2, P3, and P4 and the RGB value of the input pixel. In the above table, C0 is a point that becomes the reference in the tetrahedron. C1, C2, and C3 denote distances between the points of the selected tetrahedron. For example, the RGBW value may be interpolated according to Equation 3:

$$RGBW = C0 + C1 \times \frac{dR}{X_R} + C2 \times \frac{dG}{X_G} + C3 \times \frac{dB}{X_B}, \quad \text{[Equation 3]}$$

where dR, dG, and dB denote the decimal portion, $X_R$, $X_G$, and $X_B$ denote the integer portion, and $$\frac{dR}{X_R}, \frac{dG}{X_G}, \text{ and } \frac{dB}{X_B}$$

denote the distance ratio between each of the points and the input pixel.

Figure 8:
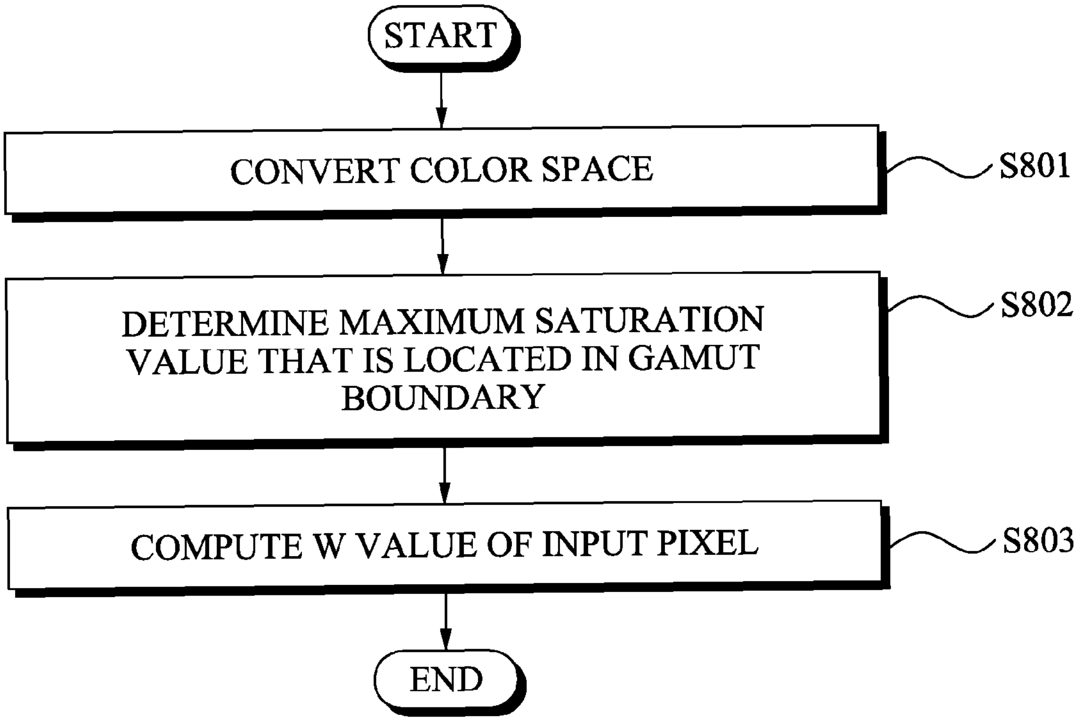
FIG. 8 is a flowchart illustrating a method of extracting a W value according to an embodiment of the present invention.

FIG. 8 is a flowchart illustrating a method of extracting a W value according to an embodiment of the present invention. Referring to FIG. 8, an RGB value of an input pixel is converted into a color space where a luminance and a saturation are independent in operation S801. For example, the color space where the luminance and the saturation are independent may be any one of CIEL*a*b, CIEXYZ, CIEYxy, YCbCr, YUV, and HSV color spaces.

Furthermore, a maximum saturation value is determined using a luminance value and a saturation value of the input pixel in operation S802. According to an aspect of the present invention, the maximum saturation value is located in a gamut boundary of the color space.

A W value of the input pixel is then computed using a saturation ratio and the luminance value in operation S803. The saturation ratio is determined based on the saturation value and the maximum saturation value determined in operation S802. According to an aspect of the present invention, the W value may be computed (operation S803) to be proportional to the luminance value of the input pixel and inversely proportional to the saturation value of the input image.

Furthermore, the W value may be computed (operation S803) according to Equation 4:

$$W_o = W_{max} \times \left[\frac{W_{max} + (W_{min} - W_{max}) \times C_{ratio}}{W_{max}}\right]^{\alpha} \quad \text{[Equation 4]}$$

$$W_{max} = k \cdot Y_{in},$$

where $W_o$ denotes the W value, $C_{ratio}$ denotes the saturation ratio, $W_{max}$ denotes the W value when the saturation ratio is minimum, $W_{min}$ denotes the W value when the saturation ratio is maximum, $Y_{in}$ denotes the luminance value of the input pixel, and k and a denote constants.

Figure 9:
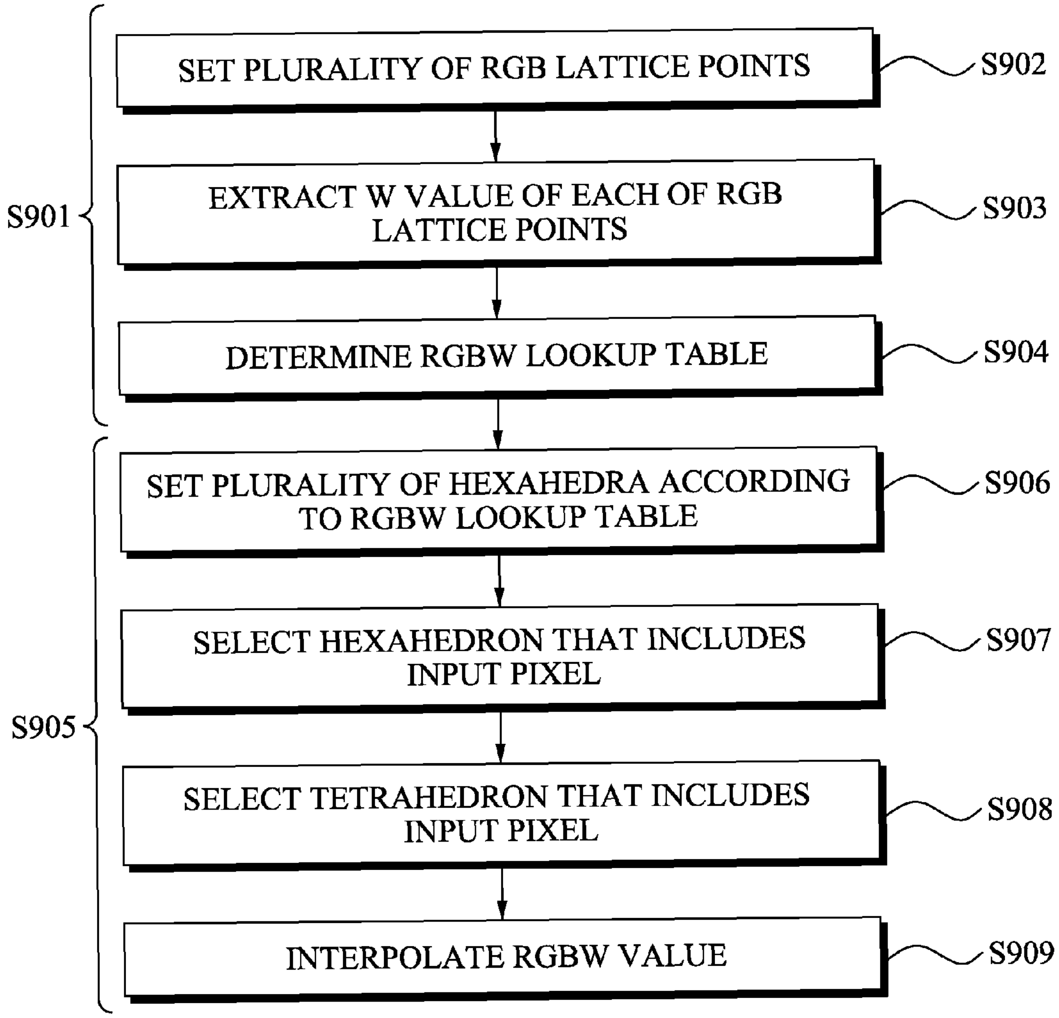
FIG. 9 is a flowchart illustrating a method of converting an RGB pixel to an RGBW pixel according to an embodiment of the present invention.

FIG. 9 is a flowchart illustrating a method of converting an RGB pixel to an RGBW pixel according to an embodiment of the present invention. Referring to FIG. 9, an RGBW lookup table is generated using an RGB lattice point in operation S901. As illustrated in FIG. 9, the generating of the RGBW lookup table (operation S901) includes operations S902, S903, and S904.

In operation S902, each of R, G, and B channels is separated by a predetermined interval and a plurality of RGB lattice points are set. In operation S903, a W value of each of the RGB lattice points is extracted (or calculated). According to an aspect of the present invention, each of the RGB lattice points is converted into a color space where a luminance and a saturation are independent, a maximum saturation value is determined using the luminance value and the saturation value of each of the RGB lattice points, wherein the maximum saturation value is located in a gamut boundary of the color space, and a W value of each of the RGB lattice points is computed using a saturation ratio and the luminance value in operation S903. The saturation ratio is determined based on the saturation value and the maximum saturation value.

Furthermore, in computing the W value (operation S903), the W value may be computed according to Equation 5:

$$W_o = W_{max} \times \left[\frac{W_{max} + (W_{min} - W_{max}) \times C_{ratio}}{W_{max}}\right]^{\alpha} \quad \text{[Equation 5]}$$

$$W_{max} = k \cdot Y_{in},$$

where $W_o$ denotes the W value, $C_{ratio}$ denotes the saturation ratio, $W_{max}$ denotes the W value when the saturation ratio is minimum, $W_{min}$ denotes the W value when the saturation ratio is maximum, $Y_{in}$ denotes the luminance value of each of the RGB lattice points, and k and a denote constants.

In operation S904, an RGBW lookup table is determined with respect to the RGB lattice point using the extracted W value (operation S903).

After the RGBW lookup table is generated (operation S901), an RGBW value with respect to an RGB value of an input pixel is computed based on the generated RGBW lookup table in operation S905. As illustrated in FIG. 9, the computing of the RGBW value (operation S905) includes operations S906, S907, S908, and S909.

In operation S906, a plurality of hexahedra is set according to the RGBW lookup table.

In operation S907, a hexahedron that includes the RGB value of the input pixel is selected from the plurality of hexahedra.

In operation S908, the selected hexahedron is separated into a plurality of tetrahedra, and a tetrahedron that includes the RGB value of the input pixel is selected from the plurality of tetrahedra.

In operation S909, the RGBW value is interpolated using points of the selected tetrahedron (operation S908) and the RGB value of the input pixel. According to an aspect of the present invention, the RGBW value may be interpolated (operation S909) using a ratio of a distance between each point of the tetrahedron and the input pixel.

Aspects of the present invention can also be embodied as computer-readable codes on a computer-readable recording medium and can be realized in a common digital computer executing the program using a computer-readable recording medium. The computer-readable recording medium is any data storage device that can store data which can be thereafter read by a computer system. Examples of the computer-readable recording medium include read-only memory (ROM), random-access memory (RAM), CD-ROMs, magnetic tapes, and floppy disks. The computer-readable recording medium can also be distributed over network coupled computer systems so that the computer-readable code is stored and executed in a distributed fashion. Moreover, the hard disk drive can be used with a computer, can be a portable drive, and/or can be used with a media player. Furthermore, aspects of the present invention can be embodied in an optical data storage devices.

According to aspects of the present invention, a W value is calculated using a maximum saturation value that is located in a gamut boundary of a color space where a luminance and a saturation are independent. In this instance, the W value is calculated such that the W value is proportional to a luminance value of an input pixel and is inversely proportional to a saturation ratio. Therefore, it is possible to calculate the W value to appropriately reflect the luminance value and the saturation value.

According to aspects of the present invention, an RGB value of an input pixel, not included in an RGBW lookup table, is converted into an RGBW value using the RGBW lookup table. In this instance, it is possible to convert the RGB value of the input pixel into the RGBW value with relatively fewer computations by using a tetrahedral interpolation based on the RGBW lookup table.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A system to compute a white (W) value of an input pixel, the system comprising:

a color space converter to convert a red-green-blue (RGB) value of the input pixel into a color space in which a luminance and a saturation are independent;

a maximum saturation value determination unit to determine a maximum saturation value using a luminance value and a saturation value of the input pixel, wherein the maximum saturation value is located in a gamut boundary of the color space; and a W value computation unit to compute the W value of the input pixel using a saturation ratio and the luminance value, wherein the saturation ratio is determined based on the saturation value of the input pixel and the maximum saturation value.

2. The system as claimed in claim 1, wherein the color space in which the luminance and the saturation are independent is one of a CIEL*a*b color space, a CIEXYZ color space, a CIEYxy color space, a YCbCr color space, a YUV color space, and a Hue Saturation Value (HSV) color space.

3. The system as claimed in claim 1, wherein the maximum saturation value determination unit determines a point that is located in the gamut boundary as the maximum saturation value, using the saturation value and the luminance value.

4. The system as claimed in claim 1, wherein the W value computation unit computes the W value to be a value that is proportional to the luminance value of the input pixel and is inversely proportional to the saturation value of the input image.

5. The system as claimed in claim 4, wherein the W value computation unit computes the W value according to:

$$W_o = W_{max} \times \left[\frac{W_{max} + (W_{min} - W_{max}) \times C_{ratio}}{W_{max}}\right]^{\alpha} \text{ and}$$

$$W_{max} = k \cdot Y_{in},$$

where $W_o$ denotes the W value, $C_{ratio}$ denotes the saturation ratio, $W_{max}$ denotes a W value when the saturation ratio is a minimum, $W_{min}$ denotes a W value when the saturation ratio is a maximum, $Y_{in}$ denotes the luminance value of the input pixel, and k and a denote constants.

6. A system to convert a red-green-blue (RGB) pixel to a red-green-blue-white (RGBW) pixel, the system comprising:

a lookup table generator to generate an RGBW lookup table using one or more RGB lattice points; and an RGBW value computation unit to compute an RGBW value of an input pixel with respect to an RGB value of the input pixel based on the generated RGBW lookup table.

7. The system as claimed in claim 6, wherein the lookup table generator comprises:

a lattice point setting unit to separate each of an R channel, a G channel, and a B channel by a predetermined interval and to set a plurality of RGB lattice points according to the separated R channel, the separated G channel, and the separated B channel;

a W value extractor to compute a W value for each of the RGB lattice points; and a lookup table determination unit to generate the RGBW lookup table with respect to each of the RGB lattice points using the corresponding computed W values.

8. The system as claimed in claim 7, wherein the W value extractor comprises:

a color space converter to convert each of the RGB lattice points into a color space in which a luminance and a saturation are independent;

a maximum saturation value determination unit to determine a maximum saturation value using a luminance value and a saturation value of each of the RGB lattice points, wherein the maximum saturation value is located in a gamut boundary of the color space; and a W value computation unit to compute the W value for each of the RGB lattice points using a saturation ratio and the luminance value, wherein the saturation ratio is determined based on the saturation value of the corresponding RGB lattice point and the maximum saturation value.

9. The system as claimed in claim 8, wherein the color space in which the luminance and the saturation are independent is one of a CIEL*a*b color space, a CIEXYZ color space, a CIEYxy color space, a YCbCr color space, a YUV color space, and an HSV color space.

10. The system as claimed in claim 8, wherein the maximum saturation value determination unit determines a point that is located in the gamut boundary as the maximum saturation value, using the saturation value and the luminance value.

11. The system as claimed in claim 8, wherein the W value computation unit computes the W value according to:

$$W_o = W_{max} \times \left[\frac{W_{max} + (W_{min} - W_{max}) \times C_{ratio}}{W_{max}}\right]^{\alpha} \text{ and}$$

$$W_{max} = k \cdot Y_{in},$$

where $W_o$ denotes the W value, $C_{ratio}$ denotes the saturation ratio, $W_{max}$ denotes a W value when the saturation ratio is a minimum, $W_{min}$ denotes a W value when the saturation ratio is a maximum, $Y_{in}$ denotes the luminance value of each of the RGB lattice points, and k and a denote constants.

12. The system as claimed in claim 6, wherein the RGBW value computation unit comprises:

a hexahedron selector to set a plurality of hexahedra according to the RGBW lookup table and to select a hexahedron that includes the RGB value of the input pixel from the plurality of hexahedra;

a tetrahedron selector to separate the selected hexahedron into a plurality of tetrahedra and to select a tetrahedron that includes the RGB value of the input pixel from the plurality of tetrahedra; and an RGBW value interpolation unit to interpolate the RGBW value of the input pixel using points of the selected tetrahedron and the RGB value of the input pixel.

13. The system as claimed in claim 12, wherein the RGBW value interpolation unit interpolates the RGBW value using a ratio of a distance between each point of the tetrahedron and the input pixel.

14. A method of extracting a white (W) value of an input pixel, the method comprising:

converting a red-green-blue (RGB) value of the input pixel into a color space in which a luminance and a saturation are independent;

determining a maximum saturation value using a luminance value and a saturation value of the input pixel, wherein the maximum saturation value is located in a gamut boundary of the color space; and computing, using a computer, the W value of the input pixel using a saturation ratio and the luminance value, wherein the saturation ratio is determined based on the saturation value of the input pixel and the maximum saturation value.

15. The method as claimed in claim 14, wherein the color space in which the luminance and the saturation are independent is one of a CIEL*a*b color space, a CIEXYZ color space, a CIEYxy color space, a YCbCr color space, a YUV color space, and a Hue Saturation Value (HSV) color space.

16. The method as claimed in claim 14, wherein the determining of the maximum saturation value comprises determining a point that is located in the gamut boundary as the maximum saturation value, using the saturation value and the luminance value.

17. The method as claimed in claim 14, wherein the computing of the W value comprises computing the W value to be a value that is proportional to the luminance value of the input pixel and is inversely proportional to the saturation value of the input image.

18. The method as claimed in claim 17, wherein the computing of the W value further comprises computing the W value according to:

$$W_o = W_{max} \times \left[\frac{W_{max} + (W_{min} - W_{max}) \times C_{ratio}}{W_{max}}\right]^{\alpha} \text{ and}$$

$$W_{max} = k \cdot Y_{in},$$

where $W_o$ denotes the W value, $C_{ratio}$ denotes the saturation ratio, $W_{max}$ denotes a W value when the saturation ratio is a minimum, $W_{min}$ denotes a W value when the saturation ratio is a maximum, $Y_{in}$ denotes the luminance value of the input pixel, and k and a denote constants.

19. A method of converting a red-green-blue (RGB) pixel to a red-green-blue-white (RGBW) pixel, the method comprising:

generating an RGBW lookup table using one or more RGB lattice points; and computing, using a computer, an RGBW value of an input pixel with respect to an RGB value of the input pixel based on the generated RGBW lookup table.

20. The method as claimed in claim 19, wherein the generating of the RGBW lookup table comprises:

separating each of an R channel, a G channel, and a B channel by a predetermined interval, and setting a plurality of RGB lattice points;

computing a W value for each of the RGB lattice points; and generating the RGBW lookup table with respect to each of the RGB lattice points using the corresponding computed W values.

21. The method as claimed in claim 20, wherein the computing of the W value comprises:

converting each of the RGB lattice points into a color space in which a luminance and a saturation are independent;

determining a maximum saturation value using a luminance value and a saturation value of each of the RGB lattice points, wherein the maximum saturation value is located in a gamut boundary of the color space; and computing the W value for each of the RGB lattice points using a saturation ratio and the luminance value, wherein the saturation ratio is determined based on the saturation value of the corresponding RGB lattice point and the maximum saturation value.

22. The method as claimed in claim 21, wherein the computing of the W value for each of the RGB lattice points comprises computing the W value according to:

$$W_o = W_{max} \times \left[\frac{W_{max} + (W_{min} - W_{max}) \times C_{ratio}}{W_{max}}\right]^{\alpha} \text{ and}$$

$$W_{max} = k \cdot Y_{in},$$

where $W_o$ denotes the W value, $C_{ratio}$ denotes the saturation ratio, $W_{max}$ denotes a W value when the saturation ratio is a minimum, $W_{min}$ denotes a W value when the saturation ratio is a maximum, $Y_{in}$ denotes the luminance value of each of the RGB lattice points, and k and a denote constants.

23. The method as claimed in claim 19, wherein the computing of the RGBW value comprises:

setting a plurality of hexahedra according to the RGBW lookup table and selecting a hexahedron that includes the RGB value of the input pixel from the plurality of hexahedra;

separating the selected hexahedron into a plurality of tetrahedra and selecting a tetrahedron that includes the RGB value of the input pixel from the plurality of tetrahedra; and interpolating the RGBW value of the input pixel using points of the selected tetrahedron and the RGB value of the input pixel.

24. The method as claimed in claim 23, wherein the interpolating of the RGBW value comprises interpolating the RGBW value using a ratio of a distance between each point of the tetrahedron and the input pixel.

25. A non-transitory computer-readable recording medium storing a program for implementing a method of extracting a white (W) value of an input pixel, the method comprising:

converting a red-green-blue (RGB) value of the input pixel into a color space in which a luminance and a saturation are independent;

determining a maximum saturation value using a luminance value and a saturation value of the input pixel, wherein the maximum saturation value is located in a gamut boundary of the color space; and computing the W value of the input pixel using a saturation ratio and the luminance value, wherein the saturation ratio is determined based on the saturation value of the input pixel and the maximum saturation value.

* * * * *

UNITED STATES PATENT AND TRADEMARK OFFICE

CERTIFICATE OF CORRECTION

PATENT NO. : 8,035,655 B2
APPLICATION NO. : 12/045799
DATED : October 11, 2011
INVENTOR(S) : Yun-Tae Kim et al.

It is certified that error appears in the above-identified patent and that said Letters Patent is hereby corrected as shown below:

Column 12, Line 31, In Claim 5, delete “a” and insert -- α --, therefor.

Column 13, Line 24, In Claim 11, delete “a” and insert -- α --, therefor.

Column 14, Line 20, In Claim 18, delete “a” and insert -- α --, therefor.

Column 14, Line 66, In Claim 22, delete “a” and insert -- α --, therefor.

Signed and Sealed this
Fourteenth Day of February, 2012

David J. Kappos
*Director of the United States Patent and Trademark Office*